(12) United States Patent
Ming

(10) Patent No.: US 11,424,311 B2
(45) Date of Patent: Aug. 23, 2022

(54) FLEXIBLE DISPLAY PANEL HAVING MASK-ETCHING METAL CONNECTION LINE IN DISPLAY AND NON-DISPLAY AREAS AND FABRICATING METHOD THEREOF

(71) Applicant: Wuhan China Star Optoelectronics Semiconductor Display Technology Co., Ltd., Wuhan (CN)

(72) Inventor: Xing Ming, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 147 days.

(21) Appl. No.: 16/769,701

(22) PCT Filed: Feb. 19, 2020

(86) PCT No.: PCT/CN2020/075831
§ 371 (c)(1),
(2) Date: Jun. 4, 2020

(87) PCT Pub. No.: WO2021/114476
PCT Pub. Date: Jun. 17, 2021

(65) Prior Publication Data
US 2022/0005910 A1    Jan. 6, 2022

(30) Foreign Application Priority Data
Dec. 12, 2019  (CN) .......................... 201911275909.7

(51) Int. Cl.
*H01L 27/32* (2006.01)
*G09F 9/30* (2006.01)
(Continued)

(52) U.S. Cl.
CPC .......... *H01L 27/3276* (2013.01); *G09F 9/301* (2013.01); *H01L 51/52* (2013.01);
(Continued)

(58) Field of Classification Search
CPC ..... H01L 27/3276; H01L 51/52; H01L 51/56; G09F 9/301
(Continued)

(56) References Cited

U.S. PATENT DOCUMENTS

| 9,450,038 B2 | 9/2016 | Kwon et al. |
| 2018/0145125 A1 | 5/2018 | Lee |

(Continued)

FOREIGN PATENT DOCUMENTS

| CN | 207116434 | 3/2018 |
| CN | 108899334 | 11/2018 |

(Continued)

*Primary Examiner* — Matthew E. Gordon

(57) ABSTRACT

A flexible display panel and a fabricating method thereof are provided. The fabricating method has: disposing an active layer and a gate of a switching tube of the flexible display panel sequentially on a substrate, wherein the switching tube is in the display area; disposing a source and a drain on the gate, wherein a signal connection line at same layer as the source and the drain is disposed in the non-display area; disposing a first insulating layer and a metal connection line sequentially on the source and the drain, wherein the first insulating layer and/or the metal connection line further extends into the non-display area and covers the signal connection line. This application increases thickness of film layers on the signal connection line, and also avoids phenomenon that the signal connection line is etched away due to over-etching upon etching the metal connection line, thereby causing disconnection phenomenon.

10 Claims, 3 Drawing Sheets

(51) Int. Cl.
*H01L 51/52* (2006.01)
*H01L 51/56* (2006.01)

(52) U.S. Cl.
CPC ........ *H01L 51/56* (2013.01); *H01L 2227/323* (2013.01); *H01L 2251/5338* (2013.01)

(58) Field of Classification Search
USPC .......................................................... 257/40
See application file for complete search history.

(56) References Cited

U.S. PATENT DOCUMENTS

2018/0366586 A1* 12/2018 Son .................... H01L 27/1262
2019/0259967 A1   8/2019 Yang
2019/0355799 A1* 11/2019 Jeong ................. H01L 27/3262

FOREIGN PATENT DOCUMENTS

| CN | 109378318 | 2/2019 |
| CN | 109585511 | 4/2019 |
| CN | 110265409 | 9/2019 |
| CN | 110504276 | 11/2019 |

* cited by examiner

FLEXIBLE DISPLAY PANEL HAVING MASK-ETCHING METAL CONNECTION LINE IN DISPLAY AND NON-DISPLAY AREAS AND FABRICATING METHOD THEREOF

RELATED APPLICATIONS

This application is a National Phase of PCT Patent Application No. PCT/CN2020/075831 having International filing date of Feb. 19, 2020, which claims the benefit of priority of Chinese Patent Application No. 201911275909.7 filed on Dec. 12, 2019. The contents of the above applications are all incorporated by reference as if fully set forth herein in their entirety.

FIELD AND BACKGROUND OF THE INVENTION

The present disclosure relates to displays, and more particularly to a flexible display panel and a fabricating method thereof.

Flexible display panels have been widely promoted due to their flexible folding characteristics, low power consumption, and small volume. Currently, flexible display panels include a display area and a non-display area. A thin film transistor (TFT) switching tube is disposed in the display area and includes a gate electrode, a source electrode, and a drain electrode, and a metal connection line is disposed on the source and the drain to connect the source or the drain to the pixel electrode. When the source, the drain, and metal connection line are fabricated, a corresponding metal layer is patterned. Among them, in the non-display area, such as a panel peripheral IC or a bonding area, after patterning, a same metal layer as the source and the drain is patterned to form a signal connection line for electrically connecting the source or drain for signal transmission during testing and subsequent practical applications.

A metal of the same metal layer as the metal connection line is also patterned. However, because a film layer above the signal connection line is too thin, when the upper metal connection line metal layer is etched to form a patterned metal connection line, the signal connection line is easily etched away, which leads to a disconnection phenomenon.

SUMMARY OF THE INVENTION

The technical problem mainly solved by the present application is to provide a flexible display panel and a fabricating method thereof, which can ensure an integrity of a signal connection line in a non-display area.

In order to solve the above technical problem, a technical solution adopted in the present application is to provide a fabricating method of a flexible display panel. The flexible display panel includes a display area and a non-display area. The fabricating method includes steps of:
  providing a substrate;
  disposing an active layer and a gate of a switching tube of the flexible display panel sequentially on the substrate, wherein the switching tube is in the display area;
  disposing a source and a drain of the switching tube on the gate, wherein a signal connection line at a same layer as the source and the drain is disposed in the non-display area, and the signal connection line is configured to connect the source or the drain to an external test circuit; and
  disposing a first insulating layer and a metal connection line sequentially on the source and the drain, wherein a pixel electrode layer is disposed on the metal connection line, and the metal connection line is electrically connected to the source or the drain to transmit a signal of the source or the drain to the pixel electrode layer, wherein the first insulating layer and/or the metal connection line further extends into the non-display area and covers the signal connection line.

Optionally, the step of the insulating layer and/or the metal connection line further extending into the non-display area and covering the signal connection line comprises:
  disposing the first insulating layer and a pixel connection layer sequentially on the source and the drain, and patterning the first insulating layer and the pixel connection layer by mask etching after disposing the first insulating layer and the pixel connection layer, wherein a mask pattern corresponding to the first insulating layer and/or a mask pattern of the metal connection line masks the signal connection line in the non-display area, so that the first insulating layer and/or the metal connection line on the signal connection line located in the non-display area remain after the etching.

Optionally, before the step of disposing the source and the drain of the switching tube on the gate, the fabricating method comprises:
  disposing a storage electrode on the gate, and the storage electrode and the gate form a storage capacitor.

Optionally, before the step of disposing the storage capacitor on the gate, the fabricating method comprises:
  disposing a second insulating layer on the gate;
  wherein the step of disposing the storage electrode on the gate comprises:
    disposing the storage electrode on the second insulating layer;
  wherein before the step of disposing the source and the drain of the switching tube on the gate, the method comprises:
    disposing a third insulating layer on the storage electrode;
  wherein the fabricating method further includes:
    disposing a fourth insulating layer on the active layer;
  wherein the step of disposing the source and the drain of the switching tube on the gate comprises:
    disposing two via holes on the second insulating layer, the third insulating layer, and the fourth insulating layer, and the via holes respectively expose two ends of the active layer, wherein the source and the drain are disposed on the third insulating layer, and the source and the drain are electrically connected to the active layer through the via holes, respectively.

Optionally, the fabricating method comprises:
disposing a fourth insulating layer on the active layer;
disposing a first filling hole in the substrate, and disposing a second filling hole in the second insulating layer, the third insulating layer, and the fourth insulating layer, wherein the first filling hole and the second filling hole are connected to each other; and
disposing flexible material to fill in the first filling hole and the second filling hole.

In order to solve the above technical problem, another technical solution adopted in the present application is to provide a flexible display panel. The flexible display panel includes a display area and a non-display area. The flexible display panel further includes:
  a substrate;

an active layer and a gate of a switching tube disposed sequentially on the substrate, wherein the switching tube is in the display area;
a source and a drain of the switching tube disposed on the gate;
a signal connection line disposed in the non-display area and at a same layer as the source and the drain, wherein the signal connection line is configured to connect the source or the drain to an external test circuit; and
a first insulating layer and a metal connection line disposed sequentially on the source and the drain, wherein a pixel electrode layer is disposed on the metal connection line, and the metal connection line is electrically connected to the source or the drain to transmit a signal of the source or the drain to the pixel electrode layer, wherein the first insulating layer and/or the metal connection line further extends into the non-display area and covers the signal connection line.

Optionally, the flexible display panel further comprises:
a storage electrode disposed on the gate, and the storage electrode and the gate form a storage capacitor.

Optionally, the flexible display panel further comprises:
a second insulating layer disposed on the gate, wherein the storage electrode is disposed on the second insulating layer;
a third insulating layer is disposed on the storage capacitor; and
a fourth insulating layer is disposed on the active layer.

Optionally, the flexible display panel further comprises:
two via holes disposed on the second insulating layer and the third insulating layer, wherein the via holes respectively expose two ends of the active layer, wherein the source and the drain are disposed on the third insulating layer, and the source and the drain are electrically connected to the active layer through the via holes, respectively.

Optionally, the flexible display panel further comprises:
a first filling hole disposed in the substrate, and a second filling hole disposed in the second insulating layer, the third insulating layer, and the fourth insulating layer, wherein the first filling hole and the second filling hole are connected to each other, and flexible material is disposed to fill in the first filling hole and the second filling hole.

Beneficial effects of the present application are that: different from a situation of the prior art, the present application provides a flexible display panel and a fabricating method thereof. The fabricating method includes: providing a substrate; disposing an active layer and a gate of a switching tube of the flexible display panel sequentially on the substrate, wherein the switching tube is in the display area; disposing a source and a drain of the switching tube on the gate, wherein a signal connection line at a same layer as the source and the drain is disposed in the non-display area, and the signal connection line is configured to connect the source or the drain to an external test circuit; and disposing a first insulating layer and a metal connection line sequentially on the source and the drain, wherein a pixel electrode layer is disposed on the metal connection line, and the metal connection line is electrically connected to the source or the drain to transmit a signal of the source or the drain to the pixel electrode layer, wherein the first insulating layer and/or the metal connection line further extends into the non-display area and covers the signal connection line.

That is, the present application sets a first insulating layer and/or a metal connection line on the signal connection line, thereby increasing a thickness of a film layer on the signal connection line, and avoiding a phenomenon that the signal connection line is etched away due to over-etching when the metal connection line is etched, thereby causing a disconnection phenomenon.

DESCRIPTION OF SPECIFIC EMBODIMENTS OF THE INVENTION

Figure 1:
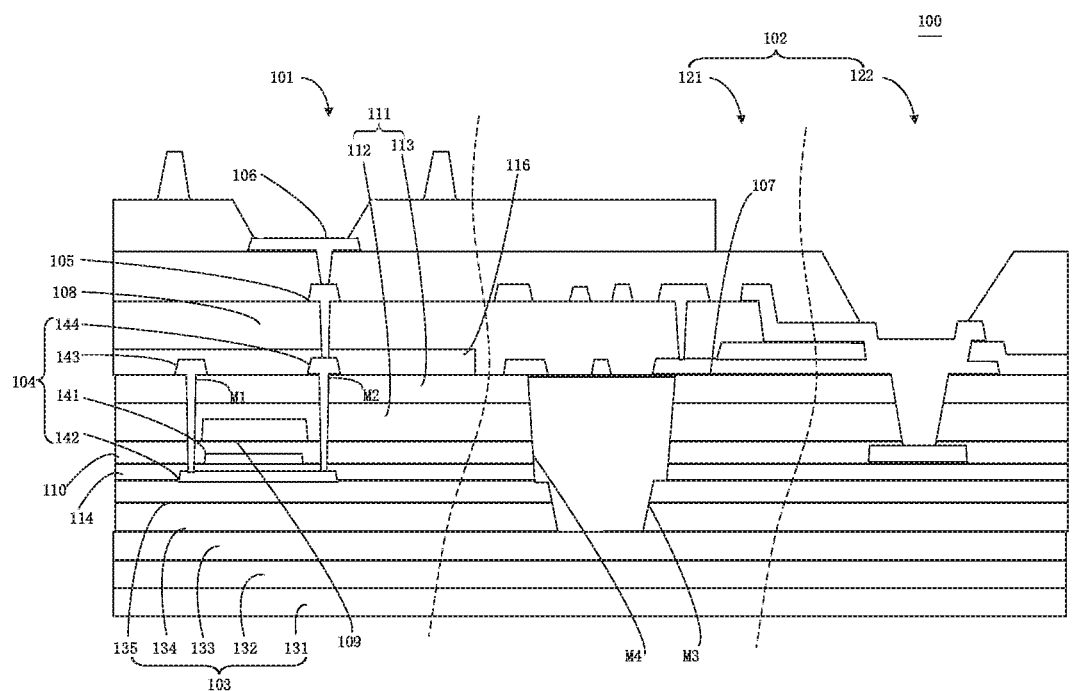
FIG. 1 is a schematic cross-sectional structural diagram of a flexible display panel according to an embodiment of the present application.

Example embodiments will now be described more fully with reference to the accompanying drawings. However, the exemplary embodiments can be implemented in various forms and should not be construed as being limited to the examples set forth herein. Rather, these embodiments are provided so that this application will be more comprehensive and complete, and will fully convey concept of example embodiments to those skilled in the art. The described features, structures, or characteristics can be combined in any suitable manner in one or more embodiments.

In addition, the drawings are merely schematic illustrations of the present application and are not necessarily drawn to scale. The same reference numerals in the drawings represent the same or similar parts, and thus repeated descriptions thereof will be omitted. Some block diagrams shown in the drawings are functional entities and do not necessarily have to correspond to physically or logically independent entities. These functional entities may be implemented in the form of software, or implemented in one or more hardware modules or integrated circuits, or implemented in different networks and/or processor devices and/or microcontroller devices.

Figure 2:
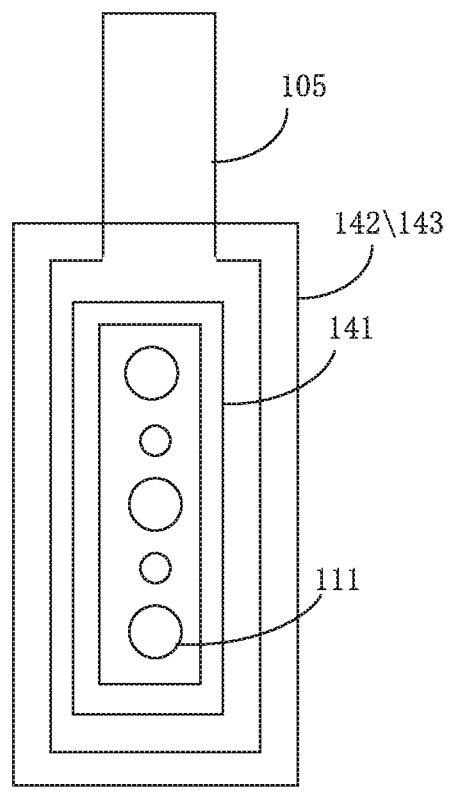
FIG. 2 is a schematic plan view of the flexible display panel shown in FIG. 1.

Refer to FIG. 1 and FIG. 2. FIG. 1 is a schematic diagram of a cross-section result of a flexible display panel provided in an embodiment of the present application; and FIG. 2 is a schematic plan view of the flexible display panel shown in FIG. 1. As shown in FIG. 1 and FIG. 2, the flexible display panel 100 of the present application may be a flexible AMOLED (Active-matrix organic light-emitting diode) display panel. The display panel 100 includes a display area 101 and a non-display area 102. The non-display area 102 includes an IC area 121 and a test binding area 122. The display area 101 is provided with an OLED (not shown) and a switching tube used to driving the OLED for display.

The flexible display panel 100 includes a substrate 103, a switching tube 104, and a pixel electrode layer 106.

The substrate 103 can be a multilayer composite structure, which can include a polyimide (PI) layer 131, an isolating layer 132, a polyimide (PI) layer 133, an isolating layer 134, and a buffering layer 135, which are sequentially disposed. The substrate 103 can be used as a substrate for components such as a switching tube 104.

The switching tube 104 is disposed in the display area 101 and can be a TFT transistor, which includes a gate 141, an active layer 142, a source 143, and a drain 144.

The active layer 142 is disposed on the substrate 103 and can be specifically disposed on a side of the buffering layer 135 away from the isolating layer 134. The active layer 142 can be made of a polysilicon material to form a semiconductor. The gate 141 is disposed on the active layer 142. The source electrode 143 and the drain electrode 144 are disposed on the gate electrode 141 at a same layer and are ohmically connected to both ends of the active layer 142.

The flexible display panel 100 further includes a metal connection line 105 disposed on the source 143 and the drain 144. A pixel electrode layer 106 is disposed on the metal connection line 105. The metal connection line 105 is electrically connected to the source 143 or the drain 144 to transmit a signal of the source 143 or the drain 144 to the pixel electrode 106. In this embodiment, as shown in FIG. 1, the metal connection line 105 is electrically connected to the drain 144. It should be understood that, in other embodiments, the metal connection line 105 can also be electrically connected to the source 143.

Therefore, when the gate 141 receives a gate driving signal, the active layer 142 can be controlled to be turned on, so that the source 143 and the drain 144 are connected through the turned-on active layer 142. When the source 143 receives the data signal, the data signal can be transmitted to the corresponding drain 144 through the active layer 142, and further transmitted to the pixel electrode layer 106 through the metal connection line 105, and the pixel electrode layer 106 is driven for pixel display.

In other embodiments, the drain 144 can also receive a data signal and transmit it to the corresponding source 143 through the active layer 142.

The flexible display panel 100 further includes a signal connection line 107 and a first insulating layer 108.

The signal connection line 107 is disposed in the non-display area 102 and is disposed on a same layer as the source 143 and the drain 144. The signal connection line 107 is used to connect the source 143 or the drain 144 to an external test circuit. In practical applications, the signal connection line 107 can be formed of a same metal as the source 143 and the drain 144, or can be formed in a same process flow.

The first insulating layer 108 is disposed on the source 143 and the drain 144, and the metal connection line 105 is disposed on the first insulating layer 108. That is, the first insulating layer 108 separates the source 143 and the drain 144 from the metal connection line 105, wherein the metal connection line is electrically connected to the source 142 through a via hole. The first insulating layer 108 and/or the metal connection line 105 further extend into the non-display area 102 and cover the signal connection line 107.

Specifically, in an embodiment, as shown in FIG. 1 and FIG. 2, the metal connection line 105 extends into an IC area 121 of the non-display area 102 and covers the signal connection line 107. A position of the first insulating layer 108 corresponding to the signal connection line 107 in the IC area 121 is patterned and etched away. The signal connection line 107 and the metal connection line 105 are electrically connected in the test binding area 122.

Figure 3:
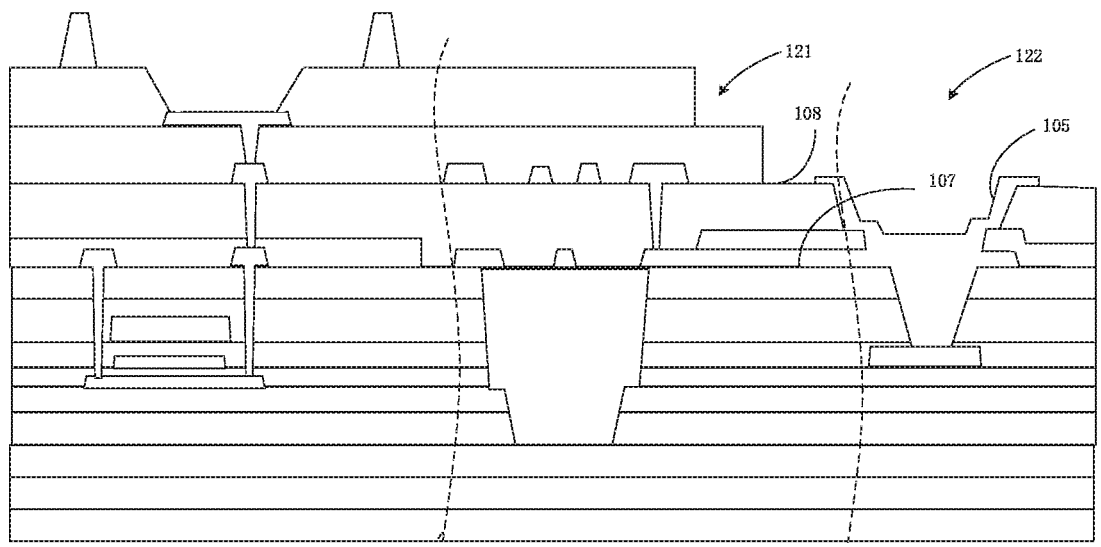
FIG. 3 is a schematic cross-sectional structural diagram of another flexible display panel according to an embodiment of the present application.
Figure 4:
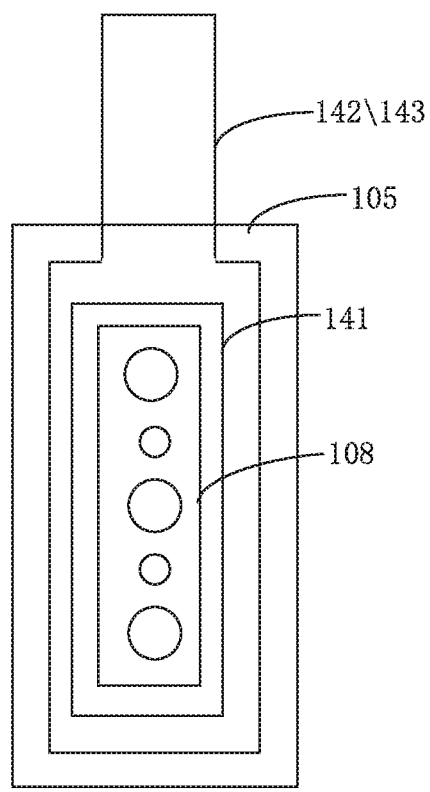
FIG. 4 is a schematic plan view of the flexible display panel shown in FIG. 3.
Figure 5:
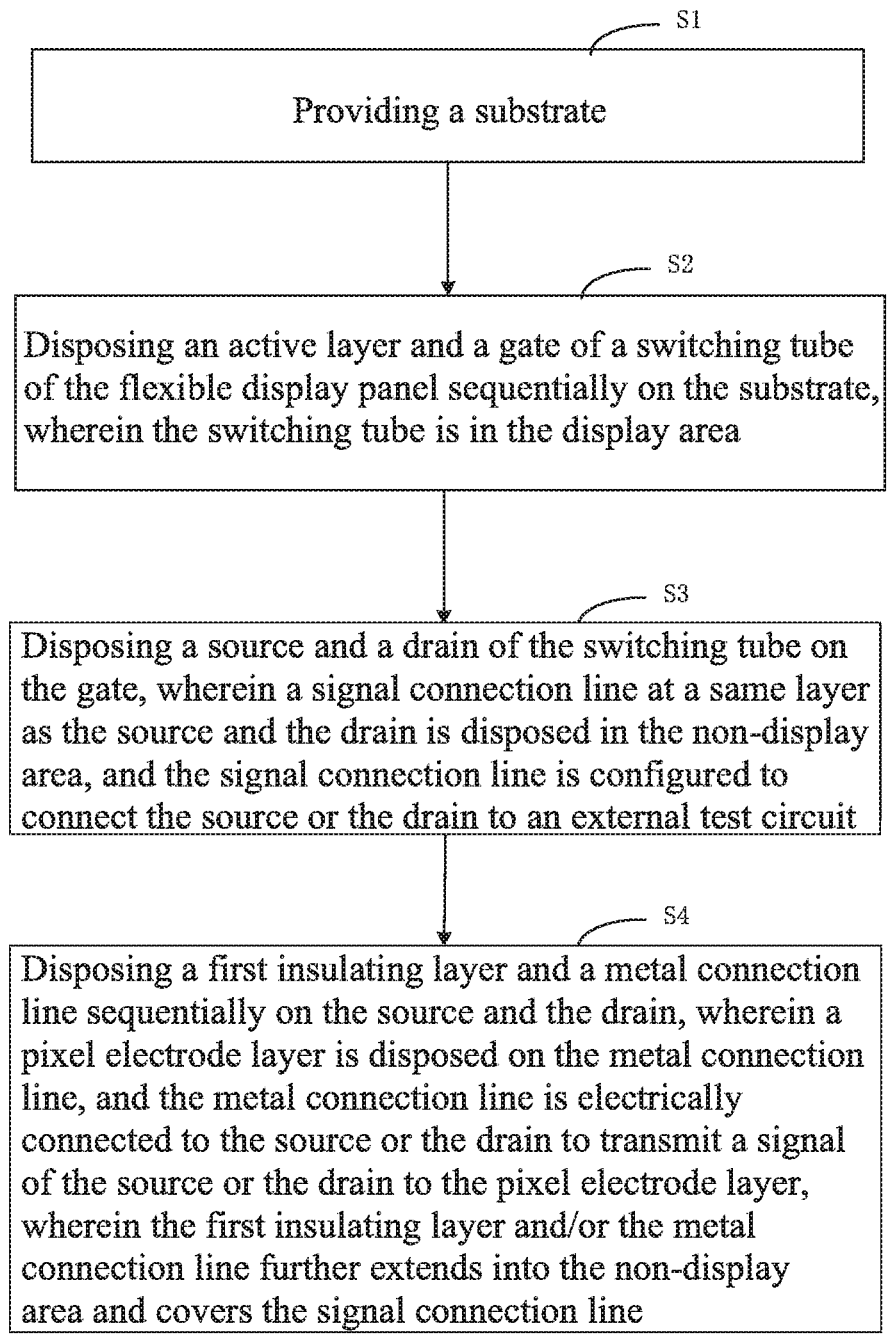
FIG. 5 is a schematic flowchart of a fabricating method of a flexible display panel according to an embodiment of the present application.

In another embodiment, as shown in FIG. 3 and FIG. 4, the first insulating layer 108 extends into the IC area 121 of the non-display area 102 and covers the signal connection line 107. A position of the metal connection line 105 corresponding to the signal connection line 107 in the IC area 121 are patterned and etched away. The signal connection line 107 and the metal connection line 105 are electrically connected in the test binding area 122.

In another embodiment, the first insulating layer 108 and the metal connection line 105 extend into the IC area 121 of the non-display area 102 and cover the signal connection line 107. The signal connection line 107 and the metal connection line 105 are electrically connected in the test binding area 122.

The flexible display panel 100 further includes a storage electrode 109. The storage electrode 109 is disposed on the gate 141, and the storage electrode 109 and the gate 141 form a storage capacitor.

The flexible display panel 100 further includes a second insulating layer 110, a third insulating layer 111, and a fourth insulating layer 114.

The second insulating layer 110 is disposed on the gate 141, and the storage electrode 109 is disposed on the second insulating layer 110. The third insulating layer 111 is disposed on the storage electrode 109 and can include a composite double-layered structure of insulating layers 112 and 113. The fourth insulating layer 114 is disposed on the active layer 142, i.e., between the active layer 142 and the gate 141.

Further, two via holes M1 and M2 are provided in the second insulating layer 110, the third insulating layer 111, and the fourth insulating layer 114. The vias M1 and M2 respectively expose two ends of the active layer 142, and the source 143 and the drain 144 are disposed on the third insulating layer 111. And, the source 143 and the drain 144 are electrically connected to the active layer 142 through the vias M1 and M2, respectively.

A first filling hole M3 is disposed in the substrate 103, and a second filling hole M4 is disposed in the second insulating layer 110, the third insulating layer 111, and the fourth insulating layer 114. In addition, the first filling hole M3 and the second filling hole M4 are provided with a PI material with better flexibility in the first filling hole M3 and the second filling hole M4.

The flexible display panel 100 further includes a polyvinyl chloride (PV) layer 116 disposed on the source 142 and the drain 143 to protect the metal of the source 142 and the drain 143 and to prevent water vapor from entering the display area along the source 142 and drain 143 metal to cause the AMOLDE device to fail.

Based on the flexible display panel described above, a fabricating method of a flexible display panel is also provided. The fabricating method includes following steps:

In a step S1, a substrate is provided.

The substrate can be a multi-layer composite structure, which can include a polyimide (PI) layer, an isolating layer, a polyimide (PI) layer, an isolating layer, and a buffering layer, which are sequentially disposed. The substrate can be used as a substrate for components such as switching tubes.

In a step S2, an active layer and a gate of a switching tube of the flexible display panel are disposed sequentially on the substrate, wherein the switching tube is in the display area.

In a step S3, a source and a drain of the switching tube are disposed on the gate, wherein a signal connection line at a same layer as the source and the drain is disposed in the non-display area, and the signal connection line is configured to connect the source or the drain to an external test circuit.

In a step S4, a first insulating layer and a metal connection line are disposed sequentially on the source and the drain, wherein a pixel electrode layer is disposed on the metal connection line, and the metal connection line is electrically connected to the source or the drain to transmit a signal of the source or the drain to the pixel electrode layer, wherein the first insulating layer and/or the metal connection line further extends into the non-display area and covers the signal connection line.

Before step S3, a storage electrode is disposed on the gate, and the storage electrode and the gate form a storage capacitor. Specifically, a second insulating layer can be disposed on the gate, and the storage electrode can be disposed on the second insulating layer.

Further, a third insulating layer is disposed on the storage capacitor, and a fourth insulating layer is disposed on the active layer. Two via holes are disposed in the second insulating layer, the third insulating layer, and the fourth insulating layer. The via holes respectively expose both ends of the active layer, and the source and the drain are disposed on the third insulating layer. The source and the drain are electrically connected to the active layer through the vias, respectively.

The step S4 further comprises: disposing the first insulating layer and a pixel connection layer sequentially on the source and the drain, and patterning the first insulating layer and the pixel connection layer by mask etching after disposing the first insulating layer and the pixel connection layer, wherein a mask pattern corresponding to the first insulating layer and/or a mask pattern of the metal connection line masks the signal connection line in the non-display area, so that the first insulating layer and/or the metal connection line on the signal connection line located in the non-display area remain after the etching.

Specifically, in an embodiment, as shown in FIG. 1, the metal connection line 105 extends into the IC area 121 of the non-display area 102 and covers the signal connection line 107. A position of the first insulating layer 108 corresponding to the signal connection line 107 in the IC area 121 is patterned and etched away. The signal connection line 107 and the metal connection line 105 are electrically connected in the binding area 122.

In another embodiment, as shown in FIG. 3, the first insulating layer 108 extends into the IC area 121 of the non-display area 102 and covers the signal connection line 107. A position of the metal connection line 105 corresponding to the signal connection line 107 in the IC area 121 is patterned and etched away. The signal connection line 107 is electrically connected with the metal connection line 105 in the binding area 122.

The method of this embodiment further includes: disposing a first filling hole in the substrate, and disposing a second filling hole in the second insulating layer, the third insulating layer, and the fourth insulating layer, wherein the first filling hole and the second filling hole are connected to each other; and disposing flexible material to fill in the first filling hole and the second filling hole.

From above, the present application sets a first insulating layer and/or a metal connection line on the signal connection line, thereby increasing a thickness of a film layer on the signal connection line, and avoiding a phenomenon that the signal connection line is etched away due to over-etching when the metal connection line is etched, thereby causing a disconnection phenomenon.

In addition, the above-mentioned drawings are merely a schematic description of processes included in a method according to an exemplary embodiment of the present application, and are not limiting purposes. It is easy to understand that the processes shown in the above drawings do not indicate or limit the chronological order of these processes. In addition, it is also easy to understand that these processes may be performed synchronously or asynchronously in multiple modules, for example.

After considering the specification and practicing the disclosure disclosed herein, those skilled in the art will readily think of other embodiments of the present application. This application is intended to cover any variations, uses, or adaptations of this application. These variations, uses, or adaptations follow the general principles of this application and include common general knowledge or conventional technical means in the technical field not disclosed in this application. The specification and embodiments are considered exemplary only. The true scope and spirit of the application is indicated by the claims.

It should be understood that the present application is not limited to the precise structure that has been described above and shown in the drawings, and various modifications and changes can be made without departing from its scope. The scope of the application is limited only by the accompanying claims.

What is claimed is:

1. A fabricating method of a flexible display panel, the flexible display panel comprising a display area and a non-display area including an IC area and a test binding area, the fabricating method comprising steps of:
   providing a substrate;
   disposing an active layer and a gate of a switching tube of the flexible display panel sequentially on the substrate, wherein the switching tube is in the display area;
   disposing a source and a drain of the switching tube on the gate, wherein a signal connection line at a same layer as the source and the drain is disposed in the non-display area, and the signal connection line electrically connects the source or the drain to an external test circuit; and
   disposing a first insulating layer and a metal connection line sequentially on the source and the drain, wherein a pixel electrode layer is disposed on the metal connection line, and the metal connection line is electrically connected to the source or the drain to transmit a signal of the source or the drain to the pixel electrode layer, wherein the first insulating layer and/or the metal connection line further extends from the IC area into the test binding area and the metal connection line in the test binding area directly covers the signal connection line.

2. The fabricating method according to claim 1, wherein the step of disposing the first insulating layer and/or the metal connection line further extending from the IC area into the test binding area and the metal connection line in the test binding area directly covering the signal connection line comprises:
   disposing the first insulating layer and the metal connection line sequentially on the source and the drain by mask etching, respectively, so that the first insulating layer and/or the metal connection line on the signal connection line located in the non-display area remain after the mask etching.

3. The fabricating method according to claim 1, wherein before the step of disposing the source and the drain of the switching tube on the gate, the fabricating method comprises:
   disposing a storage electrode on the gate, and the storage electrode and the gate form a storage capacitor.

4. The fabricating method according to claim 3, wherein before the step of disposing the storage capacitor on the gate, the fabricating method comprises:
   disposing a second insulating layer on the gate;

wherein the step of disposing the storage electrode on the gate comprises:
disposing the storage electrode on the second insulating layer;
wherein before the step of disposing the source and the drain of the switching tube on the gate, the method comprises:
disposing a third insulating layer on the storage electrode;
wherein the fabricating method further includes:
disposing a fourth insulating layer on the active layer;
wherein the step of disposing the source and the drain of the switching tube on the gate comprises:
disposing two via holes on the second insulating layer, the third insulating layer, and the fourth insulating layer, and the two via holes respectively expose two ends of the active layer, wherein the source and the drain are disposed on the third insulating layer, and the source and the drain are electrically connected to the active layer through the two via holes, respectively.

5. The fabricating method according to claim 4, further comprising:
disposing a first filling hole in the substrate, and disposing a second filling hole in the second insulating layer, the third insulating layer, and the fourth insulating layer, wherein the first filling hole and the second filling hole are connected to each other; and
disposing flexible material to fill in the first filling hole and the second filling hole.

6. A flexible display panel, comprising a display area and a non-display area including an IC area and a test binding area, the flexible display panel further comprising:
a substrate;
an active layer and a gate of a switching tube disposed sequentially on the substrate, wherein the switching tube is in the display area;
a source and a drain of the switching tube disposed on the gate;
a signal connection line disposed in the non-display area and at a same layer as the source and the drain, wherein the signal connection line electrically connects the source or the drain to an external test circuit; and
a first insulating layer and a metal connection line disposed sequentially on the source and the drain, wherein a pixel electrode layer is disposed on the metal connection line, and the metal connection line is electrically connected to the source or the drain to transmit a signal of the source or the drain to the pixel electrode layer, wherein the first insulating layer and/or the metal connection line further extends from the IC area into the test binding area and the metal connection line in the test binding area directly covers the signal connection line.

7. The flexible display panel according to claim 6, wherein the flexible display panel further comprises:
a storage electrode disposed on the gate, and the storage electrode and the gate form a storage capacitor.

8. The flexible display panel according to claim 7, wherein the flexible display panel further comprises:
a second insulating layer disposed on the gate, wherein the storage electrode is disposed on the second insulating layer;
a third insulating layer is disposed on the storage capacitor; and
a fourth insulating layer is disposed on the active layer.

9. The flexible display panel according to claim 8, wherein the flexible display panel further comprises:
two via holes disposed on the second insulating layer, the third insulating layer, and the fourth insulating layer, wherein the two via holes respectively expose two ends of the active layer, wherein the source and the drain are disposed on the third insulating layer, and the source and the drain are electrically connected to the active layer through the two via holes, respectively.

10. The flexible display panel according to claim 9, wherein the flexible display panel further comprises:
a first filling hole disposed in the substrate, and a second filling hole disposed in the second insulating layer, the third insulating layer, and the fourth insulating layer, wherein the first filling hole and the second filling hole are connected to each other, and flexible material is disposed to fill in the first filling hole and the second filling hole.

* * * * *